US008487365B2

(12) United States Patent
Sasaki et al.

(10) Patent No.: US 8,487,365 B2
(45) Date of Patent: Jul. 16, 2013

(54) SEMICONDUCTOR DEVICE AND METHOD FOR MANUFACTURING SAME

(75) Inventors: Toshiyuki Sasaki, Kanagawa-ken (JP); Noriko Sakurai, Kanagawa-ken (JP); Tokuhisa Ohiwa, Mie-ken (JP); Katsunori Yahashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 13/041,532

(22) Filed: Mar. 7, 2011

(65) Prior Publication Data

US 2011/0291178 A1    Dec. 1, 2011

(30) Foreign Application Priority Data

May 27, 2010 (JP) .................................. 2010-121238

(51) Int. Cl.
*H01L 29/792* (2006.01)
(52) U.S. Cl.
USPC ............... 257/324; 257/E29.309; 365/185.05
(58) Field of Classification Search
USPC ............. 257/324, 326, E29.309; 365/185.05
See application file for complete search history.

(56) References Cited

U.S. PATENT DOCUMENTS

| 7,558,141 | B2 | 7/2009 | Katsumata et al. |
| 8,120,961 | B2 * | 2/2012 | Katsumata et al. ...... 365/185.18 |
| 8,247,863 | B2 * | 8/2012 | Fukuzumi et al. ............ 257/324 |
| 8,373,222 | B2 * | 2/2013 | Sekine et al. ................ 257/324 |
| 8,390,055 | B2 * | 3/2013 | Higashi et al. ............... 257/324 |
| 2010/0118610 | A1 | 5/2010 | Katsumata et al. |
| 2011/0291178 | A1 * | 12/2011 | Sasaki et al. ................. 257/324 |

FOREIGN PATENT DOCUMENTS

JP   2009-146954   7/2009

* cited by examiner

*Primary Examiner* — Colleen Matthews
(74) *Attorney, Agent, or Firm* — Oblon, Spivak, McClelland, Maier & Neustadt, L.L.P.

(57) ABSTRACT

According to one embodiment, a semiconductor device includes a substrate, a lower gate layer, a stacked body, a dummy electrode layer, an insulating film, and a channel body. The lower gate layer is provided above the substrate. The stacked body includes a plurality of insulating layers and a plurality of electrode layers alternately stacked above the lower gate layer. The dummy electrode layer is provided between the lower gate layer and the stacked body, made of the same material as the electrode layer, and thicker than each of the electrode layers. The insulating film includes a charge storage film provided on a side wall of a hole formed to penetrate through the stacked body and the dummy electrode layer. The channel body is provided on an inside of the insulating film in the hole.

4 Claims, 8 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2010-121238, filed on May 27, 2010; the entire contents of which are incorporated herein by reference.

FIELD

Embodiments described herein relate generally to a semiconductor device and a method for manufacturing the same.

BACKGROUND

A technology is proposed in which a memory hole is formed in a stacked body formed by alternately stacking an electrode layer functioning as a control gate in a memory cell and an insulating layer plurally; a charge storage film is formed on the side wall of the memory hole; and then silicon is provided in the memory hole to arrange memory cells three-dimensionally. Such a structure has difficulty in processing the memory hole particularly when the number of stacked layers in the stacked body increases. The increase in the degree of processing difficulty may cause a variation in device characteristics.

DETAILED DESCRIPTION

In general, according to one embodiment, a semiconductor device includes a substrate, a lower gate layer, a stacked body, a dummy electrode layer, an insulating film, and a channel body. The lower gate layer is provided above the substrate. The stacked body includes a plurality of insulating layers and a plurality of electrode layers alternately stacked above the lower gate layer. The dummy electrode layer is provided between the lower gate layer and the stacked body, made of the same material as the electrode layer, and thicker than each of the electrode layers. The insulating film includes a charge storage film provided on a side wall of a hole formed to penetrate through the stacked body and the dummy electrode layer. The channel body is provided on an inside of the insulating film in the hole.

Embodiments will now be described with reference to the drawings. Although silicon is taken as an example of the semiconductor in the following embodiments, semiconductors other than silicon may be used.

Figure 1:
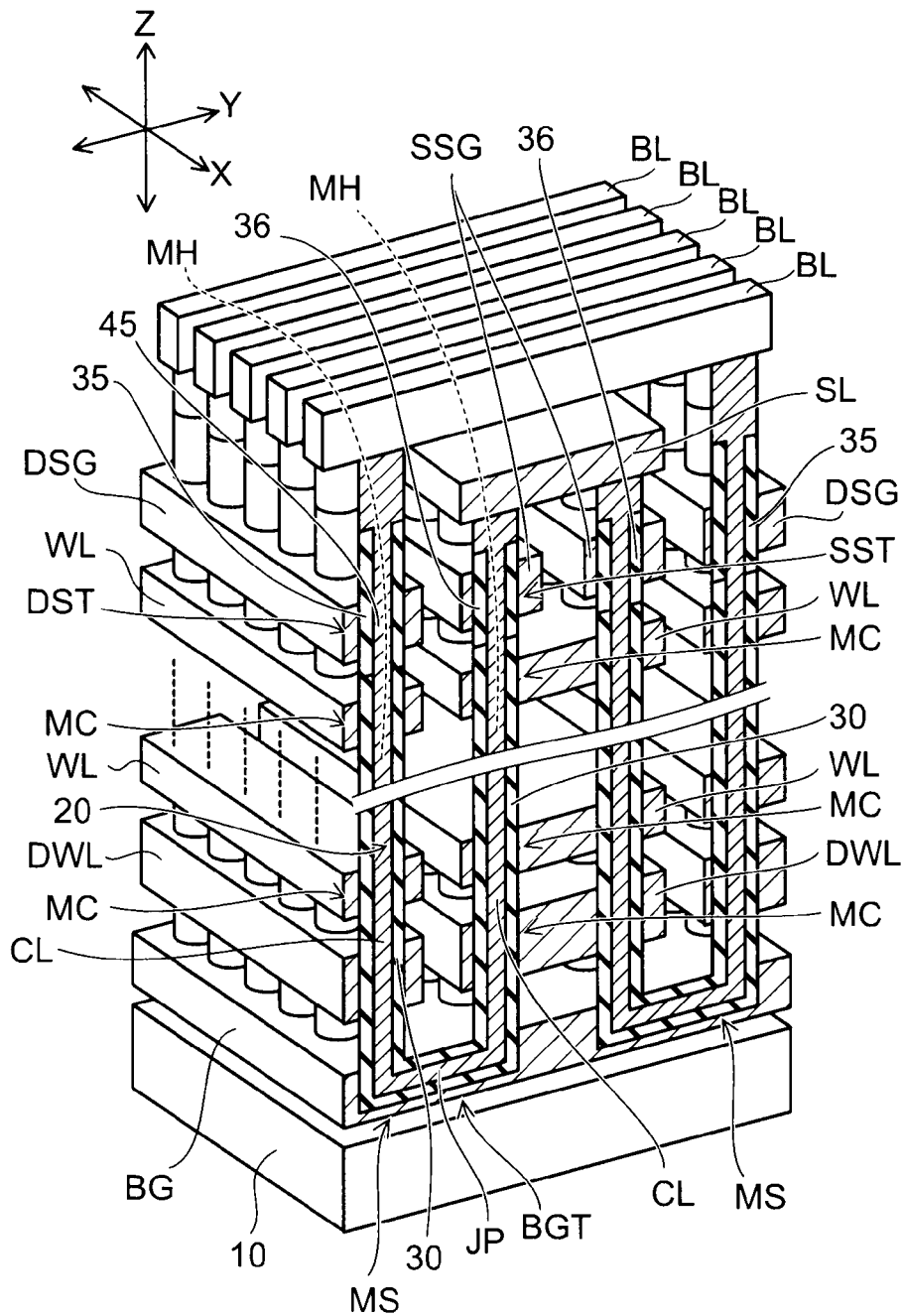
FIG. 1 is a schematic perspective view of a memory cell array in a semiconductor device of an embodiment.
Figure 7A:
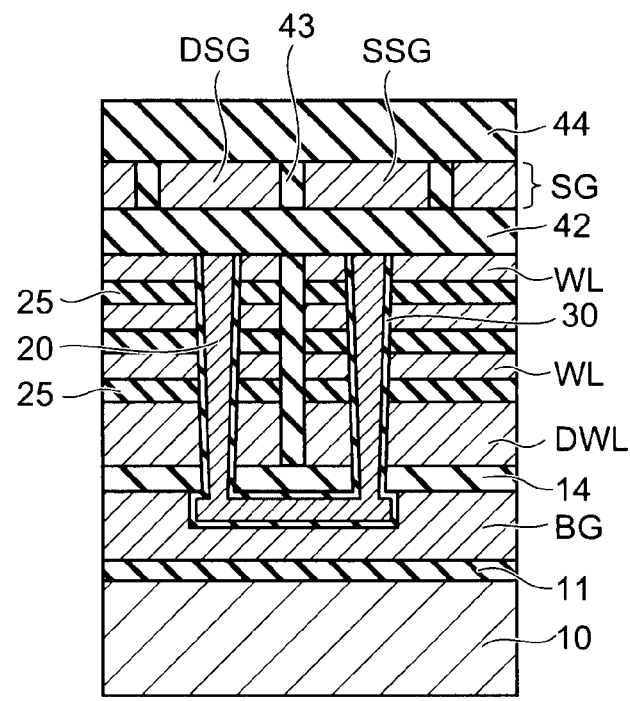
Figure 7B:
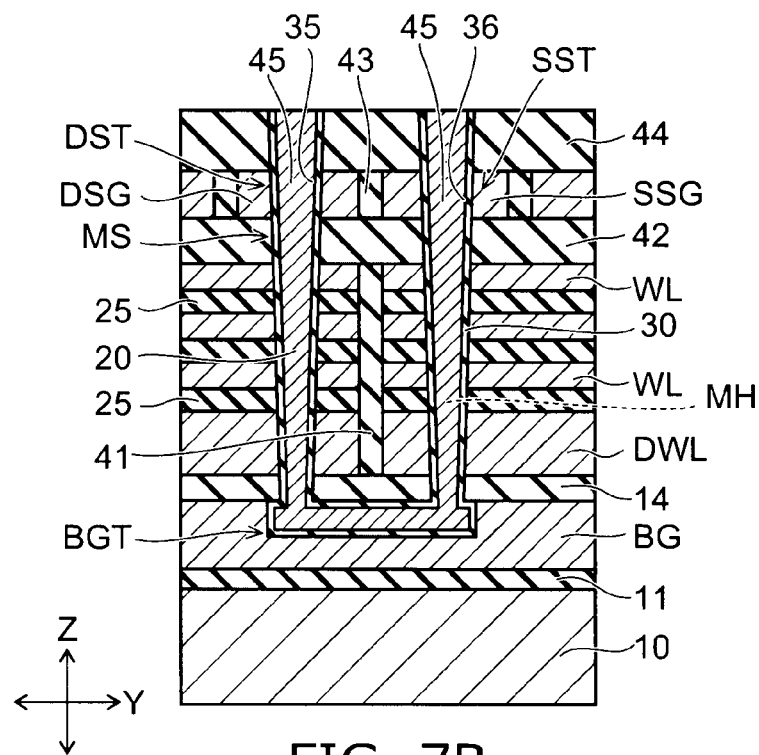

FIG. 1 is a schematic perspective view of a memory cell array in a semiconductor device of an embodiment, and FIG. 7B is a schematic cross-sectional view of one memory string MS in the memory cell array.

In FIG. 1, illustration of the insulating portions other than an insulating film formed on the inner wall of a memory hole MH is omitted for easier viewing of the drawing.

Figure 2:
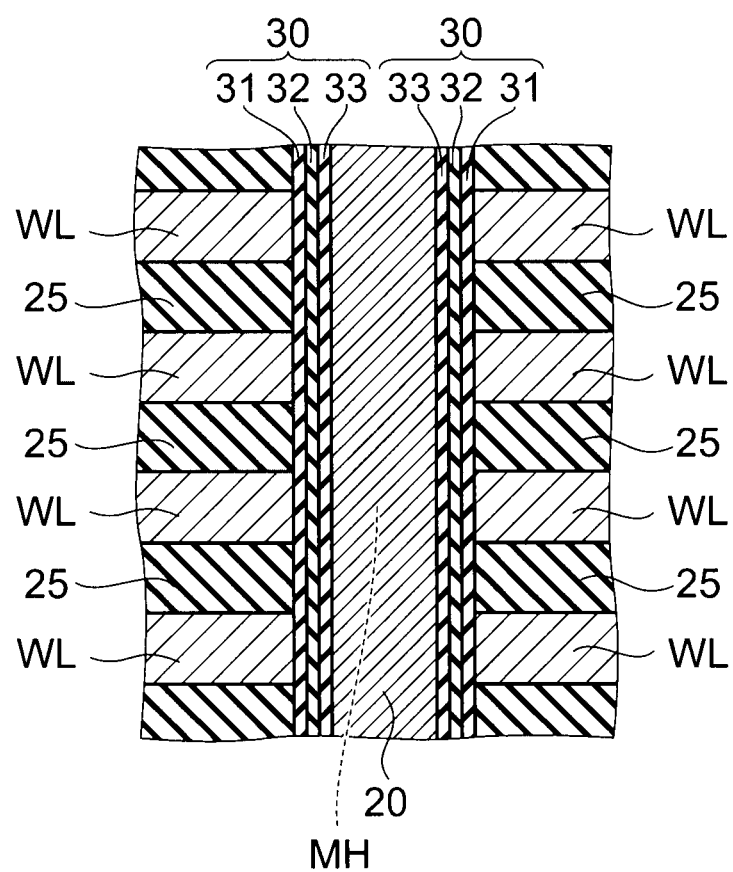
FIG. 2 is an enlarged cross-sectional view of the main portion of FIG. 1.

FIG. 2 is an enlarged cross-sectional view of a portion in which memory cells MC in FIG. 1 are provided.

In this specification, for convenience of description, an XYZ orthogonal coordinate system is used. In this coordinate system, two directions parallel to the major surface of a substrate 10 and orthogonal to each other are defined as an X direction and a Y direction, and the direction orthogonal to both the X direction and the Y direction is defined as a Z direction. The Y direction and the Z direction shown in FIG. 7B correspond to the Y direction and the Z direction in FIG. 1.

A back gate BG is provided above the substrate 10 as a lower gate layer via an insulating layer 11 shown in FIG. 7B. The back gate BG is, for example, a silicon layer doped with an impurity and having conductivity.

A dummy electrode layer DWL is provided above the back gate BG via an insulating layer 14. The dummy electrode layer DWL is, for example, a silicon layer doped with an impurity and having conductivity.

A plurality of insulating layers 25 and a plurality of electrode layers WL are alternately stacked on the dummy electrode layer DWL. The number of insulating layers 25 and the number of electrode layers WL are arbitrary. The insulating layer 25 is interposed between the lowermost electrode layer WL and the dummy electrode layer DWL. Although the uppermost layer of the stacked body described above is the electrode layer WL in FIG. 7B, the uppermost layer may be the insulating layer 25.

The electrode layer WL is made of the same material as the dummy electrode layer WL, and the material is, for example, a silicon layer doped with an impurity and having conductivity. The insulating layer 25 is, for example, a tetraethoxysilane (TEOS) layer containing silicon oxide.

The electrode layers WL have substantially equal thicknesses. The thickness of the dummy electrode layer DWL is thicker than the thickness of each electrode layer WL.

The stacked body including the electrode layers WL, the insulating layers 25, and the dummy electrode layer DWL in the memory cell array region is divided into a plurality of blocks in the Y direction, and an insulator 41 is embedded between the blocks.

A drain-side selection gate DSG is provided above the uppermost electrode layer WL in one block via an insulating layer 42. The drain-side selection gate DSG is, for example, a silicon layer doped with an impurity and having conductivity. A source-side selection gate SSG is provided above the uppermost electrode layer WL in a block adjacent to the one block via the insulating layer 42. The source-side selection gate SSG is, for example, a silicon layer doped with an impurity and having conductivity. An insulating layer 43 is interposed between the drain-side selection gate DSG and the source-side selection gate SSG.

An insulating layer 44 is provided on the drain-side selection gate DSG and the source-side selection gate SSG. A source line SL shown in FIG. 1 is provided above the source-side selection gate SSG via the insulating layer 44. The source line SL is a metal layer or a silicon layer doped with an impurity and having conductivity. A plurality of bit lines BL are provided above the source line SL via a not-shown insulating layer. Each bit line BL extends in the Y direction.

A plurality of U-shaped memory holes MH are formed in the back gate BG and the stacked body on the back gate BG. A hole that penetrates through the insulating layer 44, the drain-side selection gate DSG, the insulating layer 42, the plurality of electrode layers WL, the plurality of insulating layers 25, the dummy electrode layer DWL, and the insulating layer 14 and extends in the Z direction is formed in the block including the drain-side selection gate DSG. A hole that penetrates through the insulating layer 44, the source-side selection gate SSG, the insulating layer 42, the plurality of electrode layers WL, the plurality of insulating layers 25, the dummy electrode layer DWL, and the insulating layer 14 and extends in the Z direction is formed in the block including the source-side selection gate SSG. A pair of these holes is connected via a recess formed in the back gate BG to form the U-shaped memory hole MH, as described below.

Channel bodies 20 and 45 are provided in the memory hole MH in a U-shaped configuration. The channel bodies 20 and 45 are, for example, silicon films. The channel body 20 is provided in a portion penetrating through the plurality of electrode layers WL, the plurality of insulating layers 25, the dummy electrode layer DWL, and the insulating layer 14 and in the back gate BG. An insulating film 30 is provided between the channel body 20 and the inner wall of the memory hole MH.

The channel body 45 is provided in a portion penetrating through the drain-side selection gate DSG and a portion penetrating through the source-side selection gate SSG. A gate insulating film 35 is provided between the channel body 45 and the drain-side selection gate DSG. A gate insulating film is provided between the channel body 45 and the source-side selection gate SSG.

In addition to the structure in which the whole interior of the memory hole MH is filled with the channel bodies 20 and 45, a structure may be employed in which the channel bodies 20 and 45 are formed so that a void may remain on the central axis side of the memory hole MH and an insulator is embedded in the void on the inside of the channel bodies 20 and 45.

The insulating film 30 has an oxide-nitride-oxide (ONO) structure in which a silicon nitride film is placed between a pair of silicon oxide films, for example. As shown in FIG. 2, a first insulating film 31, a charge storage film 32, and a second insulating film 33 are provided between the electrode layers WL and the channel body 20 in this order from the electrode layer WL side. The first insulating film 31 is in contact with the electrode layer WL, the second insulating film 33 is in contact with the channel body 20, and the charge storage film 32 is provided between the first insulating film 31 and the second insulating film 33. The insulating film 30 between the dummy electrode layer DWL and the channel body 20 has a similar configuration.

The channel body 20 functions as a channel in a transistor constituting a memory cell, the electrode layer WL functions as a control gate, and the charge storage film 32 functions as a data storage layer storing charges injected from the channel body 20. That is, a memory cell having a structure in which the control gate surrounds the periphery of the channel is formed at the intersection of the channel body 20 and each electrode layer WL.

The semiconductor device according to this embodiment is a nonvolatile semiconductor memory device that can electrically erase and write data freely and retain stored contents even if the power is turned off. For example, the memory cell is a memory cell of a charge trap structure. The charge storage film 32 includes a large number of traps that confine charges (electrons), and is a silicon nitride film, for example. The second insulating film 33 is, for example, a silicon oxide film, and serves as a potential barrier when charges are injected from the channel body 20 to the charge storage film 32 or when charges stored in the charge storage film 32 diffuse into the channel body 20. The first insulating film 31 is, for example, a silicon oxide film, and prevents charges stored in the charge storage film 32 from diffusing into the electrode layer WL.

The drain-side selection gate DSG, the channel body 45, and the gate insulating film 35 between them constitute a drain-side selection transistor DST. The channel body 20 and the channel body 45 of the block including the drain-side selection transistor DST are electrically connected, and the upper end of the channel body 45 is connected to the bit line BL shown in FIG. 1.

The source-side selection gate SSG, the channel body 45, and the gate insulating film 36 therebetween constitute a source-side selection transistor SST. The channel body 20 and the channel body 45 of the block including the source-side selection transistor SST are electrically connected, and the upper end of the channel body 45 is connected to the source line SL shown in FIG. 1.

The back gate BG, the channel body 20 provided in the back gate BG, and the insulating film 30 constitute a back gate transistor BGT.

A memory cell MC having each electrode layer WL as a control gate is provided between the drain-side selection transistor DST and the back gate transistor BGT plurally in accordance with the number of electrode layers WL. Similarly, the memory cell MC having each electrode layer WL as a control gate is provided also between the back gate transistor BGT and the source-side selection transistor SST plurally in accordance with the number of electrode layers WL.

The memory cells MC, the drain-side selection transistor DST, the back gate transistor BGT, and the source-side selection transistor SST are connected in series to form one memory string MS in a U-shaped configuration. One memory string MS includes a pair of columns CL extending in the stack direction of the stacked body including the plurality of electrode layers WL and a joining portion JP embedded in the back gate BG and joining the pair of columns CL. The memory string MS is arranged plurally in the X direction and the Y direction, and thereby a plurality of memory cells MC are provided three-dimensionally in the X direction, the Y direction, and the Z direction.

The dummy electrode layer DWL functions as a control gate of a transistor (referred to as a dummy cell) that surrounds the channel body 20 via the insulating film 30 including the charge storage film 32. However, the writing of data is not performed on the charge storage film 32 in the dummy cell, and the dummy cell does not function as a memory cell that stores and retains data.

In the case where data is written to the memory cell, a write potential Vprog (e.g. about 20 V) is applied to the electrode layer WL of a memory cell to be written to. A pass potential (or a middle potential) Vpass (e.g. about 10 V) lower than Vprog is applied to the electrode layer WL of a memory cell not to be written to. Thereby, the electric field strength applied to the charge storage film 32 is enhanced only in the memory cell to be written to.

For example, when writing data "0", due to the potential difference between the channel body 20 to which 0 V is applied through the bit line BL and the electrode layer WL to which Vprog is applied, electrons are injected into the charge storage film 32 of the memory cell to be written to, and the threshold voltage Vth of the transistor (memory transistor) constituting the memory cell shifts to the positive side. Electrons are not injected to the charge storage film 32 of the memory cell in which Vpass is applied to the electrode layer WL, and writing is not performed thereon.

Also in the case where data "1" is written, that is, in the case where the threshold voltage Vth of the memory transistor is not raised from the erase state (electrons are not injected into the charge storage film 32), Vprog is applied to the electrode layer WL of the memory cell to be written to and Vpass is applied to the electrode layers WL of the other memory cells. During the writing of data "1", electrons are not injected into the charge storage film 32 of the memory cell to be written to because the gate potential of the drain-side selection transistor DST and the electric potential of the bit line BL are set equal to decrease the potential difference between the channel body 20 and the electrode layer WL to which Vprog is applied. Electrons are not injected also into the charge storage film 32 of the memory cell in which Vpass is applied to the electrode layer WL.

During the writing of data described above, Vpass, which is the same potential as that for the memory cell not to be written to, is applied to the dummy electrode layer DWL, and no data is written to the dummy cell.

When reading data, an electric potential Vread applied to the electrode layer WL of a memory cell not to be read or an electric potential that turns the transistor constituting the dummy cell into ON is applied to the dummy electrode layer DWL.

The erasing of data is performed for each block. When erasing data, 0 V (the ground potential), for example, is applied to the electrode layers WL in a selected block, and the channel body 20 is boosted to about 20 V, for example. Thereby, electrons stored in the charge storage film 32 of the memory cells are extracted to erase data.

During erasing data, Vera_pass is applied to the dummy electrode layer DWL in the selected block. Vera_pass is an electric potential that suppresses the variation in the threshold voltage of the dummy cell, and is about 5 V, for example. Alternatively, the electric potential of the dummy electrode layer DWL may be set to 0 V (the ground potential) during erasing data, because the read operation of the memory cell is not affected even if the threshold voltage of the dummy cell shifts low.

The electrode layers WL and the dummy electrode layer DWL in a not-selected block are set in a floating state. Thereby, as the electric potential of the channel body 20 increases, the electric potentials of the electrode layers WL also increase due to coupling, and electrons are not extracted from the charge storage film 32 of the memory cells.

Figure 9:
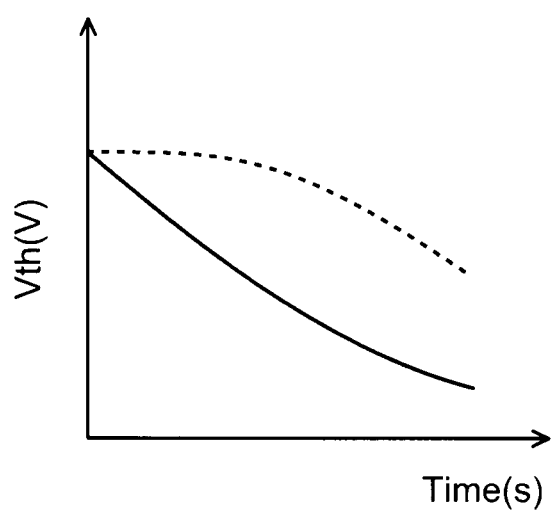
FIG. 9 is a graph for comparing the erase characteristics of a memory cell of the lowermost layer provided immediately above a back gate and the erase characteristics of a memory cell of a layer thereabove.

Here, FIG. 9 is a graph for comparing the erase characteristics of a memory cell of the lowermost layer provided immediately above the back gate BG (the broken line) and the erase characteristics of a memory cell of a layer thereabove (the solid line). The horizontal axis represents time, and the vertical axis represents the threshold voltage Vth. The erase operation is an operation that extracts electrons stored in the charge storage film 32, that is, an operation that decreases the threshold voltage Vth of the memory transistor.

In the structure in which a plurality of memory cells are stacked, a memory cell of the lowermost layer immediately above the back gate BG has a tendency to allow electrons to be extracted less readily during erasing. The tendency may cause a variation in characteristics between the memory cells of different layers. The thicknesses of the insulating layers between electrode layers adjacent in the stack direction are almost equal. In contrast, there is a case where the thickness of the insulating layer between the back gate BG and the lowermost electrode layer is different from the thickness of the insulating layer between electrode layers. It is considered that this is a cause of the difference in the erase characteristics between the memory cell of the lowermost layer and other memory cells.

In this regard, in this embodiment, the dummy electrode layer DWL is provided above the back gate BG, and the transistor (dummy cell) having the dummy electrode layer DWL as a control gate is not caused to function as a memory cell that stores and retains data. As a result, the variation in characteristics between the memory cells of different layers can be suppressed.

The dummy electrode layer DWL is formed of the same material as the electrode layer WL and with no structural difference of shape and the like from the electrode layer WL. Thus, there is no additional particular process for forming the dummy electrode layer DWL different from those for the electrode layer WL. Since the dummy electrode layer DWL is not used as a memory cell, it is not necessary to design the thickness of the dummy electrode layer DWL uniformly to the thicknesses of the electrode layers WL of other memory cells. Therefore, in this embodiment, the dummy electrode layer DWL is made thicker than the electrode layer WL of the memory cell for process reasons, as described below.

Next, with reference to FIG. 3A to FIG. 7B, a method for manufacturing a semiconductor device of an embodiment will now be described. These drawings show the same Y-Z cross section as FIG. 7B described above.

Figure 3A:
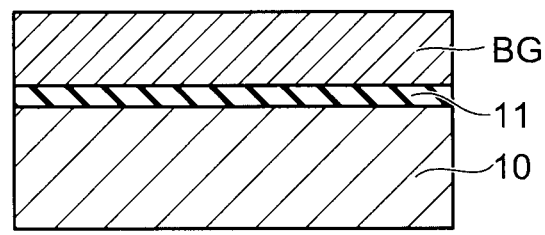
FIG. 3A to FIG. 7B are schematic cross-sectional views showing a method for manufacturing the semiconductor device of the embodiment.
Figure 3B:
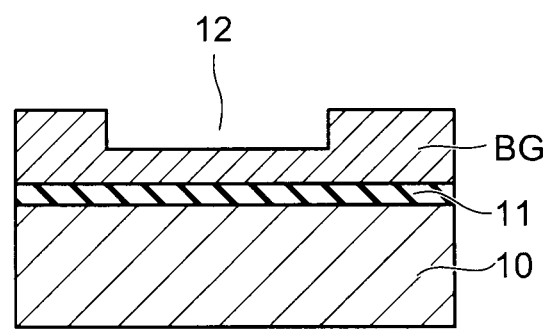
Figure 3C:
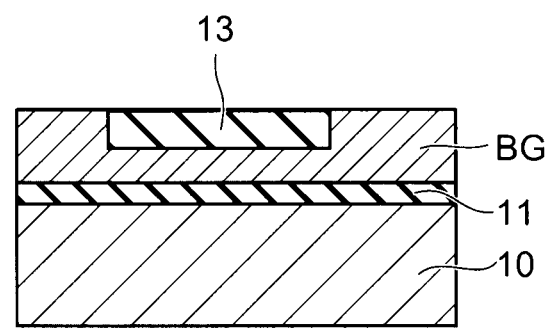

First, as shown in FIG. 3A, the back gate BG is formed above the substrate 10 via the insulating layer 11, and then a recess 12 is formed in the back gate BG as shown in FIG. 3B. Next, a sacrifice film 13 is buried in the recess 12 as shown in FIG. 3C. A silicon nitride film or a carbon film, for example, may be used as the sacrifice film 13.

Figure 4A:
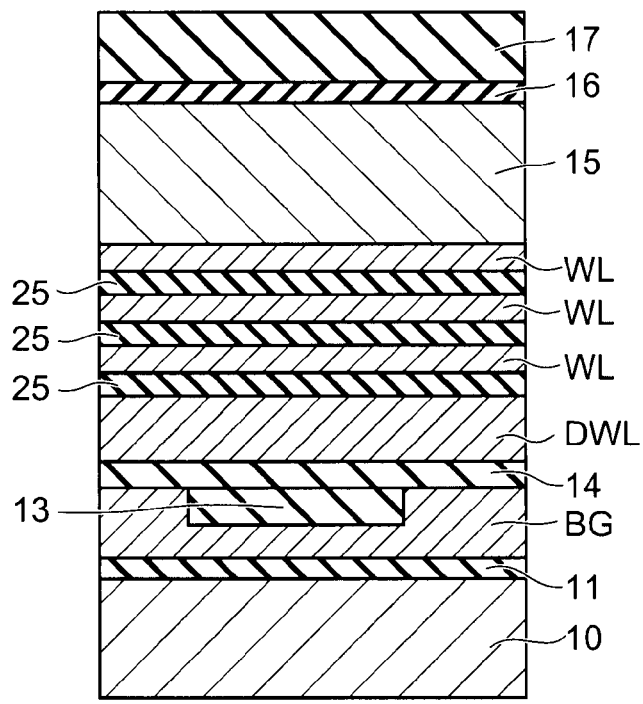

Next, as shown in FIG. 4A, the dummy electrode layer DWL is formed above the back gate BG and the sacrifice film 13 via the insulating layer 14. Further, the insulating layer 25 and the electrode layer WL are alternately stacked plurally on the dummy electrode layer DWL.

The insulating layers 14 and 25, the dummy electrode layer DWL, and the electrode layer WL are formed by, for example, the chemical vapor deposition (CVD) method. The dummy electrode layer DWL is made of a different material from the sacrifice film 13. The dummy electrode layer DWL and the electrode layer WL are formed of the same material (e.g. polysilicon). The electrode layers WL are formed with substantially equal thicknesses, and the dummy electrode layer DWL is formed thicker than each electrode layer WL.

Further, a mask layer 15, an intermediate film 16, and a resist film 17 are sequentially formed on the stacked body described above. The mask layer 15 is a carbon layer, for example. The intermediate film 16 is a silicon oxide film, for example.

Figure 4B:
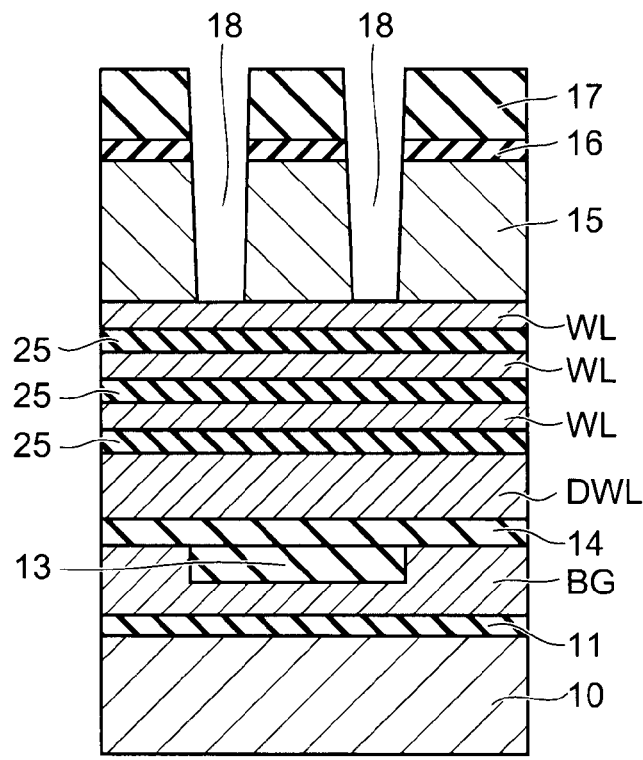

Next, patterning for forming openings selectively in the resist film 17 is performed, and then the resist film 17 patterned is used as a mask to selectively etch the intermediate film 16 and the mask layer 15 by, for example, the reactive ion etching (RIE) method. Thereby, as shown in FIG. 4B, holes 18 are formed in the mask layer 15. The hole 18 penetrates through the mask layer 15 to reach the uppermost electrode layer WL. The uppermost layer in the stacked body including the plurality of electrode layers WL and the plurality of insulating layers 25 is not limited to the electrode layer WL but may be the insulating layer 25.

Figure 5A:
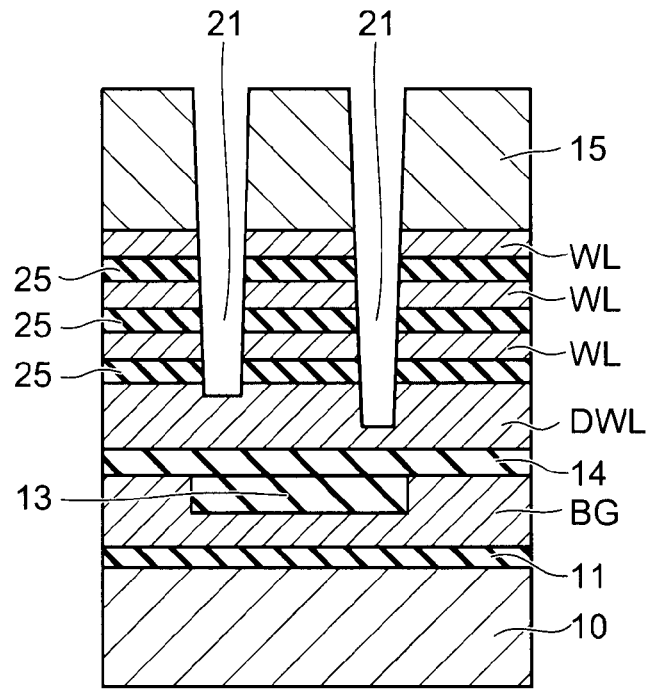

After the resist film 17 and the intermediate film 16 are removed, the mask layer 15 in which the holes 18 are formed is used as a mask to selectively etch the underlying stacked body by, for example, the RIE method. Thereby, as shown in FIG. 5A, holes 21 that penetrate through the plurality of electrode layers WL and the plurality of insulating layers 25 to reach the dummy electrode layer DWL are formed.

The etching is performed simultaneously on a plurality of portions in the surface direction of the stacked body described above to form the plurality of holes 21 simultaneously. The gas is not changed between the etching of the electrode layer WL and the etching of the insulating layer 25, and the etching is performed sequentially and collectively on the plurality of electrode layers WL and the plurality of insulating layers 25 under the same conditions using the same gas. This leads to efficient processes to reduce costs.

As the gas used for the RIE at this time, a gas is used with which etching can be performed efficiently on both of silicon, which is a major component of the electrode layer WL, and silicon oxide, which is a major component of the insulating layer 25. For example, a mixed gas of a gas containing Br (bromine) and a gas containing F (fluorine) may be used.

The structure body including the substrate 10 and the stacked body thereon is placed in a processing chamber in a wafer configuration and is held by a holding portion provided in the processing chamber. Then, HBr gas and $NF_3$ gas, or HBr gas and $SF_6$ gas, for example, are introduced into the processing chamber to make a desired reduced pressure atmosphere, and plasma is then produced in the processing chamber to perform RIE.

At this time, in the case where the hole 21 has a small hole diameter and/or the number of electrode layers WL is large to lead to a thick stacked body, that is, the aspect ratio (the ratio of depth to hole diameter) of the hole 21 is high, the etching rate changes sensitively with a change (variation) in the hole diameter. For example, in the case where the hole diameter of the hole 21 is about 50 nm, the thickness of the stacked body in which the holes 21 are formed is 1 to 2 μm, and the aspect ratio of the hole 21 is about 20 to 40, just an approximately 10 to 20% deviation in the hole diameter may cause a variation in depth of approximately 200 to 400 nm after the processing is performed in the depth direction by about 1 to 2 μm.

The sacrifice film 13 embedded in the back gate BG exists below the hole 21, and the sacrifice film 13 is a thin film with a thickness of, for example, about 100 nm. The silicon nitride film or the carbon film forming the sacrifice film 13 does not have so high etching resistance to the gas described above which can etch both of the electrode layer WL and the insulating layer 25 efficiently. Therefore, if the processing of the hole 21 is continued as is under the condition for etching the plurality of electrode layers WL and the plurality of insulating layers 25 collectively, the etching cannot be stopped at the sacrifice film 13, and a defective processing in which the hole 21 penetrates through the sacrifice film 13 may be caused partly due to the thinness of the sacrifice film 13.

In particular, in the case where the aspect ratio of the hole 21 is high and the hole diameter varies between holes 21, even if the hole diameter difference of them is small, a difference in etching rate is caused between the holes 21, and there may be a case where a hole 21 of a relatively rapid etching rate has already penetrated through the sacrifice film 13 when a hole 21 of a relatively slow etching rate has reached the sacrifice film 13.

In this embodiment, however, the dummy electrode layer DWL is provided between the stacked body in which the electrode layers WL and the insulating layers 25 are alternately stacked and the back gate BG. Furthermore, when the plurality of holes 21 reach the dummy electrode layer DWL, the etching gas is changed to etch the dummy electrode layer DWL by the RIE method. Specifically, the gas introduced into the processing chamber is changed to a mixed gas of HBr gas and $O_2$ gas to perform the etching of the dummy electrode layer DWL.

The etching at this time is the etching of the dummy electrode layer DWL which is a single layer made of the same material, and does not need to use a gas capable of etching both layers of different materials, i.e., the electrode layer WL and the insulating layer 25. The dummy electrode layer DWL is a silicon layer, for example, and the silicon nitride film or the carbon film used as the sacrifice film 13 has a high etching resistance to a gas for etching a silicon layer (e.g. the mixed gas of HBr gas and $O_2$ gas described above). Therefore, the etching can be surely stopped at the sacrifice film 13 even if the processing of the hole 21 is continued under the condition for etching the dummy electrode layer DWL.

During the etching of the dummy electrode layer DWL, although it is not necessary for $O_2$ gas to be contained, adding $O_2$ gas to HBr gas suppresses the progress of etching in the materials other than the silicon layer, serving to enhance the etching resistance of the sacrifice film 13 more.

The dummy electrode layer DWL is made of the same material as the electrode layer WL, and is etched also by the gas for etching the electrode layers WL and the insulating layers 25 collectively. As a consequence, there may be a case where, when the plurality of holes 21 have reached the dummy electrode layer DWL, a variation in depth has been caused between holes 21 as shown in FIG. 5A.

In this regard, a configuration may be used in which the dummy electrode layer DWL is formed thicker than each electrode layer WL, and the insulating layer 14 made of a different material (e.g. silicon oxide) from both the dummy electrode layer DWL and the sacrifice film 13 is provided between the dummy electrode layer DWL and the back gate BG. Thereby, the variation in etching rate between holes 21 can be reduced before reaching the sacrifice film 13.

Figure 5B:
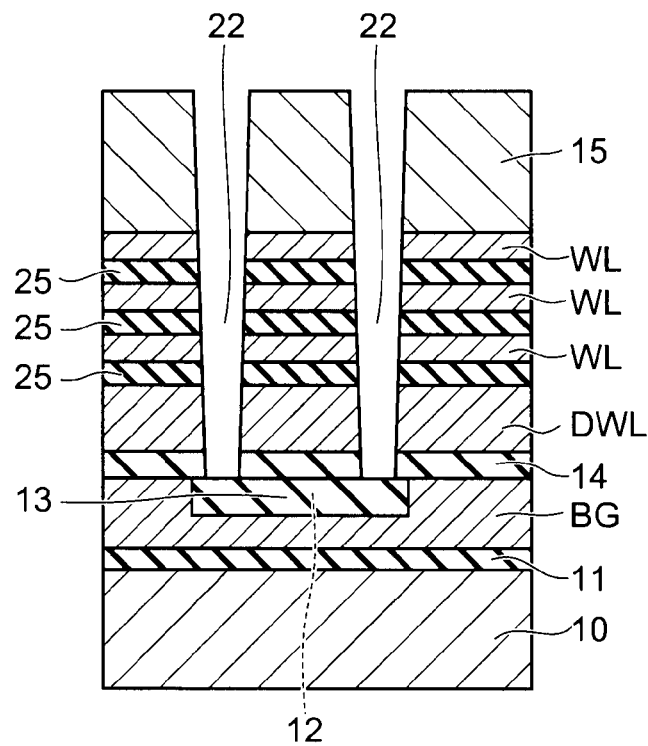

The insulating layer 14 not only ensures insulation properties between the back gate BG and the dummy electrode layer DWL, but also functions as an etching stopper during the etching of the dummy electrode layer DWL. That is, after the hole 21 reaching the dummy electrode layer DWL is formed, the gas is changed as described above to etch a portion of the dummy electrode layer DWL below the bottom of the hole 21 until reaching the insulating layer 14. After that, the gas is changed to, for example, a gas containing F (fluorine) to etch the insulating layer 14 by, for example, the RIE method. Thereby, as shown in FIG. 5B, a hole 22 is formed that penetrates through the plurality of electrodes WL, the plurality of insulating layers 25, the dummy electrode layer DWL, and the insulating layer 14 to reach the sacrifice film 13. At this point, the variation in etching rate between holes 22 is reduced, and the hole 22 can be prevented from penetrating through the sacrifice film 13.

Furthermore, in the case where the back gate BG is the same material as the dummy electrode layer DWL, such as a silicon layer, even if a part of the bottom portion of the hole deviates from above the sacrifice film 13 to above the back gate BG, the etching of the back gate BG during forming the hole can be suppressed because the insulating layer 14 is interposed between the dummy electrode layer DWL and the back gate BG.

During the RIE of the layers described above, a bias power is applied to the substrate 10 side, specifically to the side of the holding portion holding the substrate 10, and etching action due to the collision of ions accelerated toward the substrate 10 side has occurred as well. When the plurality of electrode layers WL and the plurality of insulating layers 25 are collectively etched, the bias power to the substrate 10 side is preferably relatively big in order to increase the hole processing rate. At the time of the etching of the dummy electrode layer DWL and the etching of the insulating layer 14, the bias power is preferably relatively small in order to suppress etching on the sacrifice film 13.

Although a configuration may be used in which a layer of a different material from the electrode layer WL, the insulating layer 25, and the sacrifice film 13 is provided above the back gate BG as a dummy layer, this necessitates considering the etching selectivity for the dummy layer in subsequent treatment after the hole processing, the process of removing the sacrifice film 13 described below, and the like, causing an increase in the degree of process difficulty. Furthermore, depending on the material of the dummy layer, there is a concern that the dielectric constant between the back gate BG and the stacked body in which memory cells are formed is increased to degrade the device characteristics. Therefore, the same material as the electrode layer WL, such as silicon, is preferably used as the dummy electrode layer DWL in view of device characteristics and process integration.

Figure 6A:
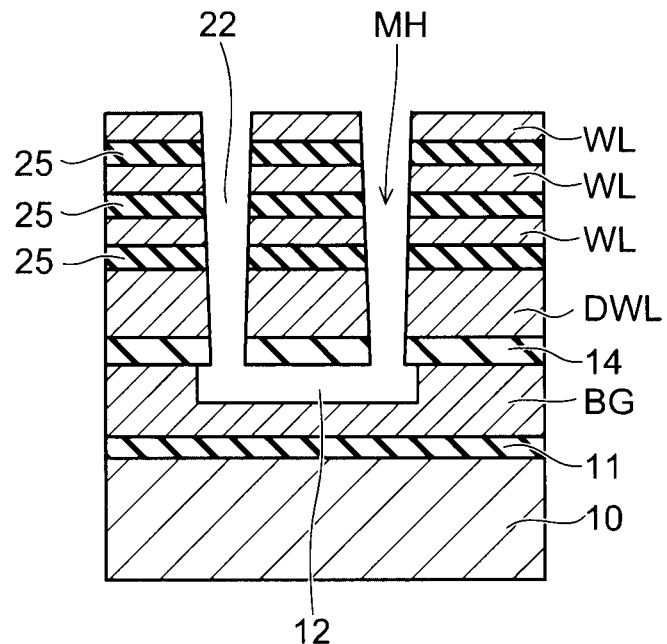

The hole 22 reaches the sacrifice film 13, and the sacrifice film 13 is exposed at the bottom of the hole 22. After the formation of the hole 22, the sacrifice film 13 is removed through the hole 22. Thereby, as shown in FIG. 6A, a pair of adjacent holes 22 and the recess 12 therebelow are joined to obtain the U-shaped memory hole MH.

Figure 6B:
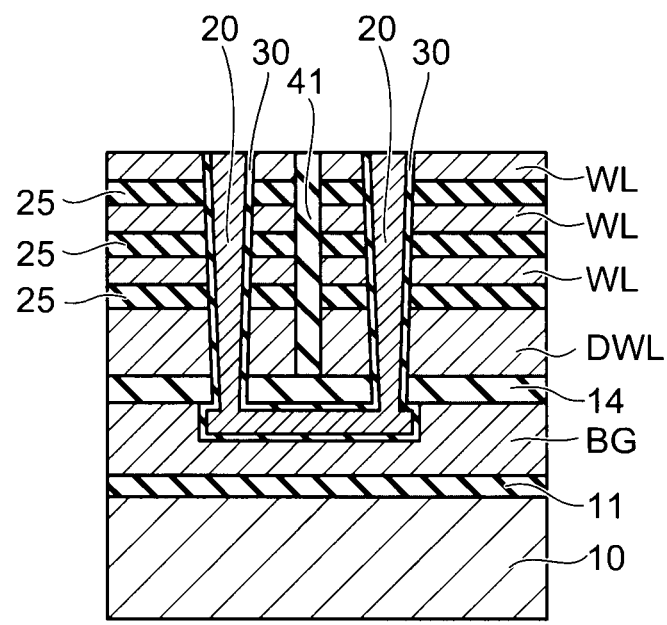

After the formation of the memory hole MH, as shown in FIG. 6B, the insulating film 30 is formed on the inner wall of the memory hole MH by, for example, the CVD method. After that, the channel body 20 is formed on the inside of the insulating film 30 in the memory hole MH by, for example, the CVD method.

After that, the stacked body including the dummy electrode layer DWL, the plurality of electrode layers WL, and the plurality of insulating layers 25 is divided into a plurality of blocks, and the insulator 41 is buried between the blocks.

Next, as shown in FIG. 7A, an upper gate layer SG is formed above the stacked body obtained through the processes described above via the insulating layer 42. Then, the upper gate layer SG is patterned to be divided into the drain-side selection gate DSG and the source-side selection gate SSG. The insulating layer 43 is provided between the drain-side selection gate DSG and the source-side selection gate SSG. After that, the insulating layer 44 is formed on the drain-side selection gate DSG and the source-side selection gate SSG.

Next, as shown in FIG. 7B, a hole that penetrates through the insulating layer 44, the drain-side selection gate DSG, and the insulating layer 42 to reach one upper end of the U-shaped channel body 20 is formed, the gate insulating film 35 is then formed on the side wall of the hole, and further the channel body 45 is then formed on the inside of the gate insulating film 35. Similarly, a hole that penetrates through the insulating layer 44, the source-side selection gate SSG, and the insulating layer 42 to reach the other upper end of the U-shaped channel body 20 is formed, the gate insulating film 36 is then formed on the side wall of the hole, and further the channel body 45 is then formed on the inside of the gate insulating film 36. After that, the source line SL, the bit line BL, other upper-layer interconnects, and the like are formed.

The memory hole MH and a hole formed in the insulating layer 42, the upper gate layer SG, and the insulating layer 44 may be collectively formed.

Before forming the hole 22, the insulating layer 42, the upper gate layer SG, and the insulating layer 44 are formed on the stacked body including the plurality of electrode layers WL. Then, the hole that penetrates through the insulating layer 44, the upper gate layer SG, and the insulating layer 42 and the hole 22 that penetrates through the stacked body described above are correctively formed by forming a mask on the insulating layer 44.

Thereby, the gate insulating film 35 of the drain-side selection transistor DST and the gate insulating film 36 of the source-side selection transitor SST can be formed simultaneously with the insulating film 30 of the memory cell. Further, the channel body 45 of the drin-side selection transistor DST and the source-side selection transitor SST and the channel body 20 of the memory cell can be formed simultaneously.

Figure 8:
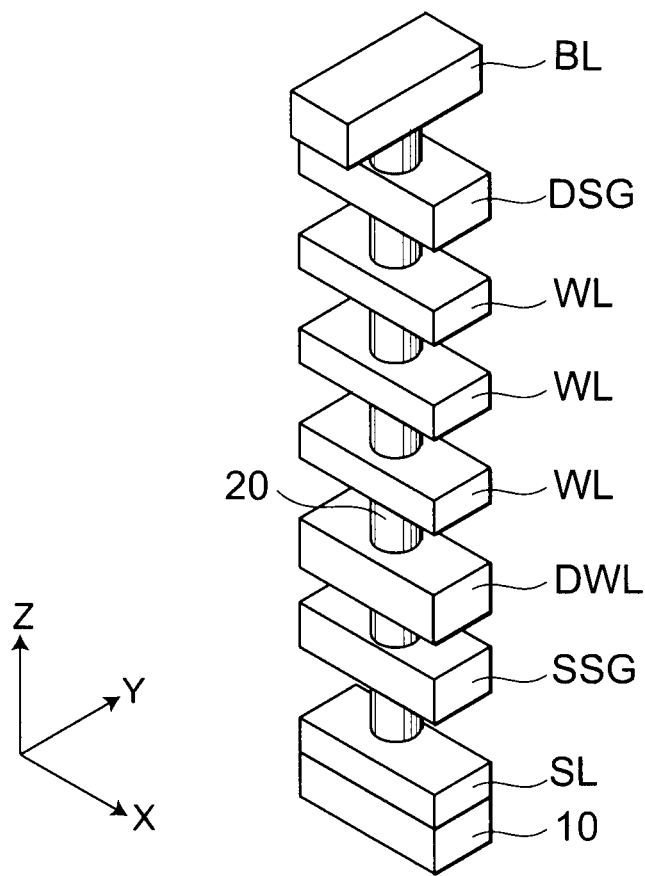
FIG. 8 is a schematic perspective view of a memory string in a semiconductor device of another embodiment.

The configuration of the memory string is not limited to the U-shaped configuration but may be an I-shaped configuration, for example, as shown in FIG. 8. In FIG. 8, only conductive portions are illustrated and insulating portions are omitted. In this structure, the source line SL is provided on the substrate 10, the source-side selection gate SSG is provided thereabove as a lower gate layer, the dummy electrode layer DWL is provided thereabove, the plurality of electrode layers WL are provided thereabove, and the drain-side selection gate DSG is provided between the uppermost electrode layer WL and the bit line BL as an upper gate layer. Also in this structure, the dummy electrode layer DWL is thicker than each electrode layer WL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a substrate;
    a lower gate layer provided above the substrate;
    a stacked body including a plurality of insulating layers and a plurality of electrode layers alternately stacked above the lower gate layer;
    a dummy electrode layer provided between the lower gate layer and the stacked body, made of the same material as the electrode layer, and thicker than each of the electrode layers;
    an insulating film including a charge storage film provided on a side wall of a hole formed to penetrate through the stacked body and the dummy electrode layer; and
    a channel body provided on an inside of the insulating film in the hole.

2. The device according to claim 1, wherein the channel body is formed in a U-shaped configuration including a pair of columns extending in a stack direction of the stacked body and a joining portion embedded in the lower gate layer and joining the pair of columns.

3. The device according to claim 1, wherein no data is written to a portion of the charge storage film opposed to the dummy electrode layer.

4. The device according to claim 1, wherein the plurality of electrode layers have substantially equal thicknesses.

* * * * *